United States Patent [19]

Feuerbaum

[11] 4,296,372
[45] Oct. 20, 1981

[54] TECHNIQUES FOR IMPRESSING A VOLTAGE WITH AN ELECTRON BEAM

[75] Inventor: Hans-Peter Feuerbaum, Munich, Fed. Rep. of Germany

[73] Assignee: Siemens Aktiengesellschaft, Berlin & Munich, Fed. Rep. of Germany

[21] Appl. No.: 41,613

[22] Filed: May 23, 1979

[30] Foreign Application Priority Data

Jun. 2, 1978 [DE] Fed. Rep. of Germany ....... 2824308

[51] Int. Cl.³ ............................................ G01N 27/00
[52] U.S. Cl. .......................... 324/71 EB; 324/158 D; 29/574
[58] Field of Search .......... 324/71 EB, 158 T, 158 D, 324/72.5; 29/574

[56] References Cited

U.S. PATENT DOCUMENTS 3,373,353  3/1968  Harris ........................... 324/71 EB

OTHER PUBLICATIONS

Walker et al., Electron Beam Testing Apparatus for Integrated Circuits, IBM Tech. Disc. Bull., vol. 10, No. 2, Jul. 1967, pp. 175-176.
Crosthwait, "Scanning Electron Microscopy", Part IV-11TR1, Chicago/USA, SEM, Apr. 1976, pp. 515-520.

*Primary Examiner*—Michael J. Tokar
*Attorney, Agent, or Firm*—Hill, Van Santen, Steadman, Chiara & Simpson

[57] ABSTRACT

An insulated conductive region, such as a doped semiconductor region in a semiconductor substrate and/or a metal conductor carried insulated on a substrate is subjected to non-destructive testing to determine the electrical integrity of the region. The outer portion of the insulating material may be, for example, a passivating layer and is provided with a metal film which extends over a conductive region to be tested. An electrical potential is applied to the metal film and the structure is subjected to electron beam radiation of sufficient energy level to provide a diffusion cloud which extends from the metal film to the region undergoing tests to form an electrical connection therewith. A voltage measurement taken at the region, with respect to a reference provides an indication of the electrical integrity of the tested region.

6 Claims, 2 Drawing Figures

TECHNIQUES FOR IMPRESSING A VOLTAGE WITH AN ELECTRON BEAM

BACKGROUND OF THE INVENTION

1. Field of the Invention

The present invention is concerned with techniques for providing non-destructive testing of an insulated electrical region, and is more particularly concerned with impressing a voltage into an electric component of an integrated circuit, which has a passivating layer of electrically insulating material, through the utilization of an electron beam.

2. Description of the Prior Art

It is well known in the art that an electron beam can be used for proximity testing of the function of electronic components, particularly of integrated circuits. For this purpose, the integrated circuit is mounted into the sample chamber of a scanning electron microscope. The primary electron beam triggers secondary electrons on the surface of the component, the energy of which can be measured with a spectrometer.

In order to check such electronic components, voltages can be impressed from the exterior. For this purpose, mechanical probes are placed on conducting areas of the component. It is, however, customary in case of such components having a base of semiconductor material, to provide the surface, for the sake of passivation, with a layer of electrically insulating material, for example, silicon oxide (SiO) or silicon dioxide ($SiO_2$). The passivating layer covers the electrically conducting areas of the component and prevents contacting by a mechanical probe without destruction of the surface layer.

With the primary electron beam of a scanning electron microscope, it is possible to inject charges into the surface of the insulating passivating layer. This injection charge carriers into the isolator can be used for analysis of leakage currents, as suggested in "Scanning Electron Microscopy", Part IV-IITRI, Chicago/USA, SEM, April 1976, pp. 515-520. A tampering into the electrical behavior of the circuit is thus, however, not possible.

SUMMARY OF THE INVENTION

The object of the present invention is to provide for non-destructive testing of electrical components by the impression of voltages into electron components having a passivating layer of electrically insulating material.

The aforementioned object is achieved according to the present invention in that the passivating layer is at least partially provided with a metal film, which is connected to a supply voltage and upon which an electron beam is directed. The acceleration voltage of the electron beam is selected such that it builds up a diffusion cloud within the passivating layer, and that the diffusion cloud by means of its beam-induced conductivity connects the component with the metal film in an electrically conducting manner. The electron beam thereby serves only as a circuit breaker for shortcircuiting and for production of the conductive connection between the metal film and the conducting area, for example, a conductor of an integrated circuit. By means of the impressed voltage, one obtains information concerning the function and operation of the component, as well as information about errors present, for example, an interruption in the conductive path, in a simple manner.

BRIEF DESCRIPTION OF THE DRAWINGS

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
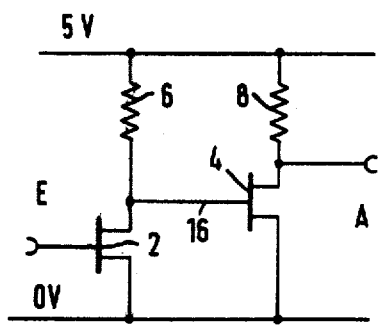
FIG. 1 is a schematic circuit diagram of an electronic component which may advantageously be constructed in integrated circuit form.

Referring to FIG. 1, an amplifier circuit is illustrated which comprises two transistors 2 and 4 which, for amplification, are connected in tandem and in each case are arranged in series with a respective load resistor 6 and 8 between a supply voltage of, for example, 5 volts and 0 volts. The amplifier circuit includes an input E and an output A. A main electrode of the transistor 2 which carries the load current is connected by way of a conductor 16 with the control electrode of the transistor 4. In a practical embodiment, the amplifier circuit can, for example, be a portion of an integrated circuit, which contains the connecting conductor 16 as a conductive path.

Figure 2:
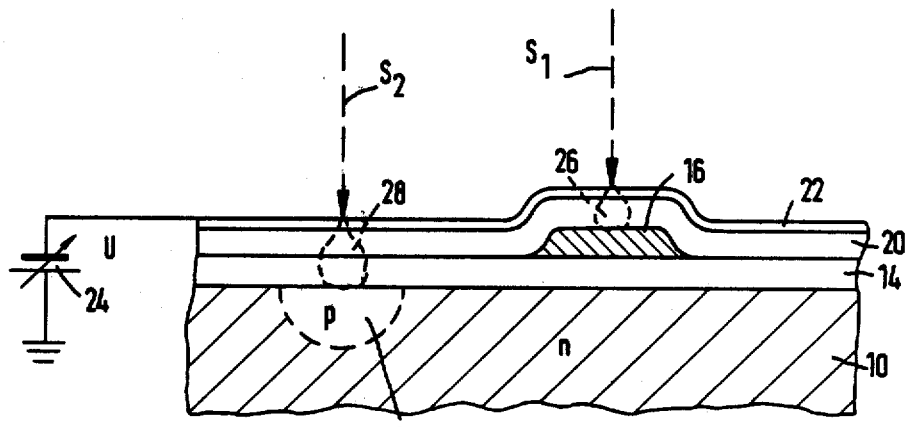
FIG. 2 illustrates, in a fragmentary sectional view, a slice through a portion of the circuit of FIG. 1.

In order to check the operation of the integrated circuit, as represented in FIG. 2, a voltage is to be impressed from the exterior of the circuit to the conductive path 16, which voltage then serves as a control voltage for the transistor 4 and allows the amplified signal to appear at the output A, as long as the conductive path 16, or further conducting conductors of the transistor 4, contain no interruptions.

According to FIG. 2, the amplifier circuit of FIG. 1 is arranged upon a base 10 of semiconductor material, for example n-conducting silicon. The semiconductor body 10 includes a p-conducting area 12, which, for example, can be produced by diffusion of p-conducting doping material. The region 12 can function, for example, as a resistor or as a conductive path within the semiconductor material of the integrated circuit. The surface of the semiconductor body 10 is provided with an oxide layer 14, which serves as a protective layer and, for example, can consist of silicon oxide (SiO) or silicon dioxide ($SiO_2$) and have a thickness of, for example, approximately 1 $\mu$m. The protective layer 14 carries the conductive path 16 of the amplifier. The surface of the component is also provided with an insulating layer 20, also having a thickness of, for example, approximately 1 $\mu$m, which serves as a passivating layer and represents a protection against mechanical damage, as well as the protection against corrosion of the conductive paths, for example the conductive path 16 of the component.

The passivating layer 20 is at least partially provided with a metal film 22 as a covering, which can consist of aluminum or of gold, and which is deposited according to the particular purpose. The thickness of the metal film 22 is also calculated so that, on the one hand, its conductivity is sufficient for limiting the voltage drop within the film, and, on the other hand, that one obtains a sufficient penetration depth of the electron beam into the component. The thickness can therefore be approximately an order of magnitude less than the thickness of the passivating layer 20 and, for example, can amount to 0.1 μm. The metal film 22 is connected to a voltage source 24 so that a voltage U is delivered and is available for impression into the electrically conducting areas of the component. The voltage U should, for example, be impressed to the conductive path 16 with a primary electron beam $S_1$ of a scanning electron microscope. For this purpose, the primary electron beam $S_1$ is directed upon the metal film 22 above the conductive path 16 with an acceleration voltage of the primary electron of, for example, $U_{PE}=10$ kV. By means of the primary electrons, a diffusion cloud 26 arises in the passivating layer 20. The electrons diffused in all directions and release electron-hole pairs. The oxide becomes electrically conductive and thereby forms an electrically conducting connection between the conductive path 16 and the metal film 22. The voltage U is thereby impressed on the conductive path 16 and can be checked, whether the component reacts to the impressed voltage, for example by the connection of a voltage-sensitive instrument to the output A (FIG. 1).

Further, a connection of the metal film 22 with the doped region 12 is possible. For this purpose, the primary electrons must penetrate the two insulating areas 14 and 20, in addition to the metal film 22. Therefore, a primary electron beam $S_2$ is directed toward the region 12 with a correspondingly higher acceleration voltage of, for example, $U_{PE}=15$ kV upon the metal film above the region 12. A corresponding diffusion cloud 28 forms in the metal film 22 and in the two insulating layers and extends to the diffusion region 12. The external voltage U is thus impressed on the region 12 of the component by means of the beam-induced conductivity arising within the diffusion cloud 28, and the electron beam $S_1$ or $S_2$ serves only as a circuit breaker. The beam therefore produces the local beam-induced conductivity and thereby causes the electrical contact between the metal film 22 and the corresponding portions of the integrated circuit. As with the conductive path 16, the electron beam $S_2$, and the resulting voltage U provided to the region 12, will provide a response at the output A, assuming that the component is without interruptions, or other flaws which would, of course, degrade the voltage.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In an electrical device of the type which includes an electrically conductive region which is covered with an insulating material, and the insulating material is covered with a passivating material, the improvement therein for non-destructive testing of the electrical integrity of the electrically conductive region, comprising:

a metal layer carried on the passivating material over the electrically conductive region for connection to a supply potential, said metal layer and the insulating material and the passivating material permeable and responsive to electron radiation to form an electrical connection between the electrically conductive region and the metal layer, and thus carry the supply potential.

2. In an electrical device of the type which includes a semiconductor substrate having an electrically conductive region therein and insulating material covering the substrate, and including passivating material covering the insulating material, the improvement therein for nondestructive testing of the electrical conductive integrity of the electrically conductive region, comprising:

a metal layer carried on the passivating material over the electrically conductive region for connection to a supply potential, said metal layer and the insulating material and the passivating material permeable and responsive to electron radiation to form an electrical connection between the electrically conductive region and the metal layer, and thus carry the supply potential.

3. In an electrical device of the type in which a semiconductor substrate having a doped conductive region therein carries a first insulating layer having a conductive strip thereon and a passivating second insulating layer covers the first insulating layer and the conductive strip, the improvement therein for non-destructive testing of the electrical integrity of the doped conductive region and the conductive strip, comprising:

a metal film carried on the passivating second insulating layer and extending over the doped conductive region and the conductive strip for connection to a supply potential, said metal film and the passivating second insulating layer permeable and responsive to electron radiation of a first predetermined energy level to form a first electrical connection between the conductive strip and said metal film, said metal film and the first and second insulating layers permeable and responsive to electron rqdiation of a second, greater energy level to form a second electrical connection between the doped conductive region and said metal film, said first and second electrical connections extending the supply potential to said conductive strip and said doped conductive region.

4. In an electrical device of the type which includes a substrate having an electrically conductive path thereon which is covered by an insulating layer, and the insulating layer is covered by a passivating layer, the improvement therein for non-destructive testing of the electrical continuity of the conductive path, comprising:

a metal layer carried on the passivating layer over the conductive path for connection to a supply potential, said metal layer, the passivating layer and the insulating layer permeable and responsive to electron radiation to form an electrical connection and extend the supply potential between said metal layer and the conductive path.

5. A process for non-destructive testing of a conductor which is in an electrical circuit and which is covered with an insulating material, and the insulating material is covered with a passivating material, comprising the steps of:

applying a metal layer over the passivating material;

applying an electrical potential to the metal layer;

radiating the metallized structure with an electron beam to form an electrical connection between the conductor and the metal layer; and measuring the electrical potential at a selected point of the electrical circuit.

6. A process for non-destructive testing of a semiconductor electronic component which has a semiconductor substrate with a doped conductive region therein, a first insulating layer covering the substrate, a conductive strip on the first insulating layer and a passivating second insulating layer covering the conductive strip and the first insulating layer, comprising the steps of:

applying a metal layer on the passivating second insulating layer;

applying an electrical potential to the metal layer;

applying an electron beam of a first energy level to an area of the metal layer over the conductive strip to form a first electrical connection between the metal layer and the conductive strip;

applying an electron beam of a second higher energy level to an area of the metal layer over the doped conductive region to form a second electrical connection between the doped conductive region and the metal layer; and measuring at least one potential at at least one point of the electronic semiconductor component.

* * * * *